United States Patent
Okanishi

(10) Patent No.: US 7,825,457 B2
(45) Date of Patent: Nov. 2, 2010

(54) SEMICONDUCTOR DEVICE AND MANUFACTURING METHOD THEREFOR

(75) Inventor: Masatomi Okanishi, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/414,646

(22) Filed: Apr. 27, 2006

(65) Prior Publication Data

US 2007/0052017 A1  Mar. 8, 2007

Related U.S. Application Data

(63) Continuation of application No. PCT/JP2005/008057, filed on Apr. 27, 2005.

(51) Int. Cl.
*H01L 29/792* (2006.01)

(52) U.S. Cl. .......... 257/324; 257/325; 257/326; 257/390; 257/391; 257/392; 257/393; 257/335; 257/336; 257/344; 257/351; 257/E21.703; 257/E27.098; 257/E27.099; 257/E27.112; 438/369; 438/370; 438/371; 438/372; 438/373

(58) Field of Classification Search .......... 257/335, 257/336, 344, 351, 380, 903, E21.703, E27.098, 257/E27.099, E27.112, 324–326, 390–393; 438/369–373

See application file for complete search history.

(56) References Cited

U.S. PATENT DOCUMENTS

| 5,032,881 | A | * | 7/1991 | Sardo et al. ........... 257/316 |
|---|---|---|---|---|
| 5,480,819 | A | * | 1/1996 | Huang ................. 438/263 |
| 6,011,725 | A | | 1/2000 | Eitan |
| 6,133,098 | A | * | 10/2000 | Ogura et al. .......... 438/267 |
| 6,180,472 | B1 | | 1/2001 | Akamatsu et al. |
| 6,248,633 | B1 | * | 6/2001 | Ogura et al. .......... 438/267 |
| 6,492,665 | B1 | * | 12/2002 | Akamatsu et al. ....... 257/192 |
| 6,744,664 | B1 | * | 6/2004 | Wu ................. 365/185.03 |
| 6,767,778 | B2 | * | 7/2004 | Wang et al. .......... 438/197 |
| 2004/0051133 | A1 | * | 3/2004 | Sugita et al. .......... 257/315 |
| 2004/0102004 | A1 | | 5/2004 | Arai |

FOREIGN PATENT DOCUMENTS

| JP | 07-321303 | 12/1995 |
|---|---|---|
| JP | 11-345888 | 12/1999 |
| JP | 2000106436 | 4/2000 |
| JP | 2001094076 | 4/2001 |
| WO | WO03071606 | 8/2003 |

\* cited by examiner

*Primary Examiner*—Lynne A Gurley
*Assistant Examiner*—Meiya Li

(57) ABSTRACT

There is provided a semiconductor device including a semiconductor substrate (10), a high concentration diffusion region (22) formed within the semiconductor substrate (10), a first low concentration diffusion region (24) that has a lower impurity concentration than the high concentration diffusion region (22) and is provided under the high concentration diffusion region (22), and a bit line (30) that includes the high concentration diffusion region (22) and the first low concentration diffusion region (24) and serves as a source region and a drain region, and a manufacturing method therefor. Reduction of source-drain breakdown voltage of the transistor is suppressed, and a low-resistance bit line can be formed. Thus, a semiconductor device that can miniaturize memory cells and a manufacturing method therefor can be provided.

17 Claims, 9 Drawing Sheets

SEMICONDUCTOR DEVICE AND MANUFACTURING METHOD THEREFOR

CROSS-REFERENCES TO RELATED APPLICATIONS

This is a continuation of International Application No. PCT/JP2005/008057 filed Apr. 27, 2005, which was not published in English under PCT Article 21(2).

BACKGROUND OF THE INVENTION

1. Field of the Invention

The present invention relates to a semiconductor device and a manufacturing method therefor. In particular, the present invention relates to a semiconductor device having a bit line that serves as a source region and a drain region and is buried in a semiconductor substrate.

2. Description of the Related Art

In recent years, non-volatile memory semiconductor devices wherein data can be overwritten are widely used. In the technical field of such non-volatile memories, technological developments are being made to miniaturize memory cells for high storage capacity. For example, there are metal oxide nitride oxide silicon (MONOS)-type Flash memories and silicon oxide nitride oxide silicon (SONOS)-type Flash memories in which electric charge is stored in an oxide/nitride/oxide (ONO) film. Furthermore, flash memories have been developed that have two or more charge storage regions in one transistor for the purpose of increasing storage capacity. For example, U.S. Pat. No. 6,011,725 discloses a transistor having two charge storage regions between a gate electrode and a semiconductor substrate. This transistor interchanges the source and drain and is symmetrically operated. In this manner, a structure that does not differentiate between the source region and the drain region may be provided. Furthermore, bit lines serve as the source and drain regions and are buried in the semiconductor substrate. In this way, the memory cells can be miniaturized.

A conventional manufacturing method is explained referring to FIGS. 1(a) through 1(d). In FIG. 1(a), a tunnel oxide film 12 (silicon oxide film) and a trap layer 14 (silicon nitride film) are formed on a P-type semiconductor substrate 10 in this order. A photoresist 40 is applied and an opening is formed using an ordinary exposure technique. In FIG. 1(b), arsenic, for example, is ion-implanted with the photoresist 40 as a mask, and an N-type high concentration diffusion region 22 is formed. In FIG. 1(c), a pocket implantation is performed with the same photoresist 40 as the mask, and pocket implantation regions 28 are formed. The pocket implantation is a method of forming P-type regions with a higher concentration than the P-type semiconductor substrate 10 next to both sides of the high concentration diffusion region 22, by, for example, boron implantation at an angle (such as 15°) to the vertical direction of the semiconductor substrate 10. In this manner, the junction profile near the high concentration diffusion region 22 on the semiconductor substrate 10 surface can be steepened. Thus, when a voltage is applied between the source region and the drain region (bit line 30a), the electric field near the high concentration diffusion region 22 can be enlarged.

In FIG. 1(d), the photoresist 40 is removed and a top oxide film 16 (silicon oxide film) is formed. In this way, an ONO film 18 composed of the tunnel oxide film 12, the trap layer 14, and the top oxide film 16 is formed. A polycrystalline silicon film is formed and a predetermined area is removed using an ordinary exposure technique and an etching technique. Thus, a word line 32 that serves as a gate electrode is formed. Subsequently, the flash memory is completed by formation of an interlayer insulating film 34, formation of a wiring layer 36, and formation of a protective film 38.

The semiconductor substrate 10 between the bit lines 30a functions as a channel, electric charge is stored in the ONO film between the channel and the word line 32, and this flash memory functions as a non-volatile memory. The storage of electric charge in the ONO film 18 is performed by applying a high electric field between the source region and the drain region (namely, between the bit lines 30a), and implanting electrons that have become high energy into the trap layer 14 within the ONO film 18. In addition, favorable writing characteristics can be obtained because the electric field near the high concentration diffusion region 22 on the surface of the semiconductor substrate 10 can be enlarged by the performance of pocket implantation.

In addition, data is erased by applying a negative voltage to the gate electrode (namely, word line 32) and generating Fowler-Nordheim (F-N) tunneling or Band to Band Tunneling current in the tunnel oxide film 12. The charge storage regions can be formed in two locations between the bit lines 30a under the word line 32, by interchanging the source region and the drain region with each other.

Because the bit line 30a is formed from the diffusion region, the resistance thereof is higher than the resistance of metal. As a result, the programming and erasing characteristics become poor. Therefore, the bit line 30a is connected to the wiring layer 36 by contact holes formed on the interlayer insulating film 34 every time a plurality of word lines 32 is crossed. In order to miniaturize the memory cells, the bit line 30a is required to have a low resistance and it is necessary to reduce the number of contact holes connecting with the wiring layer 36.

Conventionally, in order to lower the resistance of a bit line 30a for the purpose of miniaturizing the memory cells, it is preferable to increase the energy and increase the dosage of the ion implantation that forms the bit line 30a. Furthermore, it is preferable to shorten the distance between the bit lines 30a. However, because the bit line 30a serves as the source region and the drain region, the source region and the drain region are formed with a high energy and high dosage. Therefore, in writing data and the like, if a high voltage is applied between the source region and the drain region (namely, between the bit lines 30a), junction current flows between the source region and the drain region reducing the source-drain breakdown voltage. In addition, reading characteristics for reading data may also be degraded. These issues interfere with the miniaturization of the memory cells.

SUMMARY OF THE INVENTION

The present invention intends to suppress the reduction of the breakdown voltage between the source and drain and allow the formation of low-resistance bit lines. Thus, an object of the present invention is to provide a semiconductor device that enables miniaturization of memory cells and a manufacturing method therefor.

According to an aspect of the present invention, there is provided a semiconductor device including a semiconductor substrate, a high concentration diffusion region that is formed in the semiconductor substrate, a first low concentration diffusion region that is formed under the high concentration diffusion region and has a lower concentration of impurities than the high concentration diffusion region, and a bit line that includes the high concentration diffusion region and the first low concentration diffusion region and serves as a source region and a drain region. In accordance with the present invention, the junction profile of a bottom portion of the high concentration diffusion region can be reduced, thereby reducing the electric field of the bottom portion even when high voltage is applied between the bit lines. Thus, the junction current between the bottom portions can be suppressed and the source-drain breakdown voltage can be improved. In addition, the high concentration diffusion region can be formed by high energy, high dosage ion implantation and the formation of a low-resistance bit line is possible. Furthermore, the distance between the bit lines can be shortened, thereby providing a semiconductor with miniaturized memory cells.

The semiconductor device may include pocket implantation regions that are formed on both sides of the high concentration diffusion region and are included in the bit line. When the pocket implantation regions are provided and writing characteristics are improved, the junction current increases. However, through the provision of the first low concentration diffusion region, the junction current can be suppressed even when there are pocket implantation regions, thereby improving the source-drain breakdown voltage. Thus, a semiconductor device that enables the miniaturization of memory cells can be provided.

The semiconductor device may be configured so that the width of the first low concentration diffusion region is narrower than that of the high concentration diffusion region. With this structure, improved writing characteristics due to the pocket implantation can be maintained while suppressing the junction current from the bottom portion of the high concentration diffusion region.

The semiconductor device may alternatively be configured so that the width of the first low concentration diffusion region is approximately equal to that of the high concentration diffusion region. With this structure, the first low concentration diffusion region can be formed over the entire bottom surface of the high concentration diffusion region, thereby more effectively suppressing the flow of the junction current.

In addition, the semiconductor device may include second low concentration diffusion regions that are formed on both sides of the high concentration diffusion region and included in the bit line, the second los concentration diffusion regions having a lower concentration of impurities than the high concentration diffusion region. With this structure, the junction profile of the side sections of the high concentration diffusion region can be reduced, thereby reducing the electric field of the side sections even when high voltage is applied between the bit lines. Thus, through the provision of the first low concentration diffusion region and the second low concentration diffusion regions, the junction current in the side sections, in addition to the junction current in the bottom portion of the high concentration diffusion region, can be suppressed, and the source-drain breakdown voltage can be further improved.

The semiconductor device may also include an ONO film that is provided on the semiconductor substrate and a word line that is provided on the ONO film and serves as a gate electrode. In addition, the present invention can be a semiconductor device in which the ONO film has multiple charge storage regions under the gate electrode and between the bit lines.

According to another aspect of the present invention, there is provided a manufacturing method for a semiconductor device including the step of forming a high concentration diffusion region that is included in a bit line and serves as a source region and a drain region in a semiconductor substrate and the step of forming a first low concentration diffusion region under the high concentration diffusion region, the first low concentration diffusion region that is included in the bit line and has a lower concentration of impurities than the high concentration diffusion region. In accordance with the present invention, the junction profile of the bottom portion of the high concentration diffusion region can be reduced. Therefore, the electric field of this bottom portion is reduced even when high voltage is applied between the bit lines, thereby suppressing the junction current between the bottom portions and improving the source-drain breakdown voltage. As a result, the high concentration diffusion region can be formed by high energy, high dosage ion implantation, formation of low-resistance bit line is possible, and the distance between the bit lines can be shortened. From the foregoing, a semiconductor that enables miniaturization of memory cells can be provided.

The manufacturing method may include the step of forming a mask layer on the semiconductor substrate, during which the step of forming the high concentration diffusion region and the step of forming the first low concentration diffusion region respectively include the step of performing ion implantation on the semiconductor substrate with the mask layer as a mask.

The manufacturing method may also be configured so that an opening in the mask layer may be expanded by ion implantation, and the step of forming the high concentration diffusion region is performed after the step of forming the first low concentration diffusion region. In addition, the manufacturing method may be configured so that the mask layer is a photoresist layer. Thus, the first low concentration diffusion region can be formed with few manufacturing steps.

The manufacturing method may further be configured so that the mask layer includes a metal or insulating film. With this structure, the width of the high concentration diffusion region and the width of the first concentration diffusion region can be formed approximately equal. Thus, the flow of the junction current can be more effectively suppressed.

Also, the manufacturing method may include the step of forming side walls on the side sections of the mask layer and the step of forming the high concentration diffusion region is a step of performing ion implantation with the mask layer as a mask and the step of forming the first low concentration diffusion region is a step of performing ion implantation with the mask layer and the side walls as the mask. In accordance therewith, the widths of the high concentration diffusion region and the first low concentration diffusion region can be accurately formed, thereby suppressing fluctuations in transistor characteristics. In addition, through the arbitrary design of the width of the side walls, shift amount of the high concentration diffusion region and the first low concentration diffusion region can be designed arbitrarily. Thus, the desired transistor design becomes possible.

The manufacturing method may also include the step of performing ion implantation with the mask layer as a mask and forming pocket implantation regions included in the bit lines on both sides of the high concentration diffusion region. When the pocket implantation regions are provided and writing characteristics are improved, the junction current increases. However, through the provision of the first low concentration diffusion region, the junction current can be suppressed even when there are pocket implantation regions and, consequently, the source-drain breakdown voltage can be improved. Thus, a manufacturing method of a semiconductor device that enables the miniaturization of the memory cells can be provided.

The manufacturing method may additionally include the step of forming second low concentration diffusion regions on both sides of the high concentration diffusion region, the second low concentration diffusion regions having a lower concentration of impurities than the high concentration diffusion region and included in the bit line. Thus, the junction profile of the side sections of the high concentration diffusion region can be reduced, and the electric field of the side sections can be reduced even when high voltage is applied between the bit lines. Therefore, by providing the first low concentration diffusion region, the junction current between the side sections as well as the junction current between the bottom portion of the high concentration diffusion region can be suppressed and the source-drain breakdown voltage can further be improved.

The manufacturing method may also include the step of forming an ONO film on the semiconductor substrate and the step of forming a word line serving as a gate electrode on the ONO film.

As described above, in accordance with the present invention, the source-drain breakdown voltage of the transistor can be suppressed and a low resistance bit line can be formed, thereby providing a semiconductor device that enables the miniaturization of the memory cells and a manufacturing method therefor.

DESCRIPTION OF THE PREFERRED EMBODIMENTS

Figure 1A:
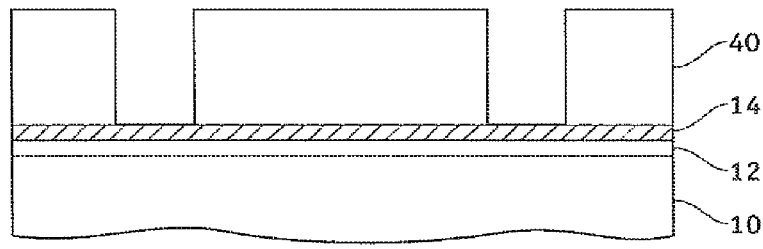
FIGS. 1(*a*) to 1(*d*) are respective cross-sectional diagrams showing a conventional semiconductor device and a manufacturing method therefor.
Figure 1B:
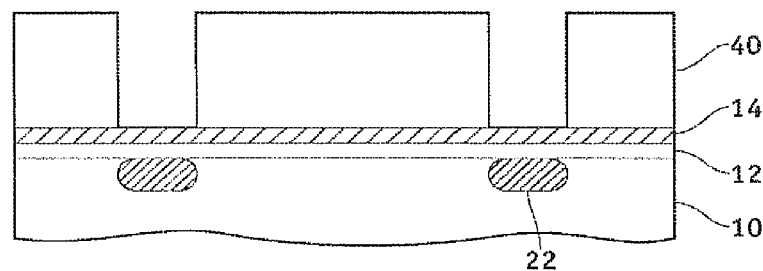
Figure 1C:
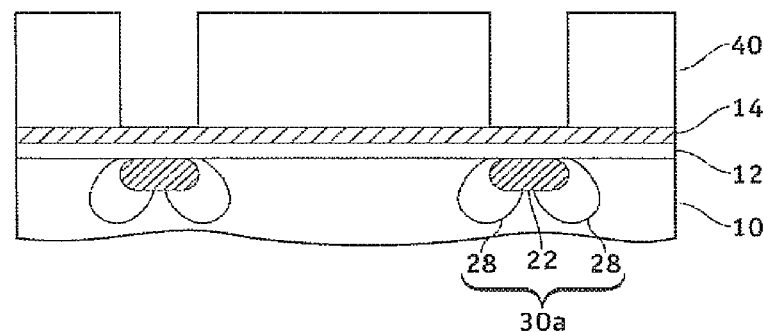
Figure 1D:
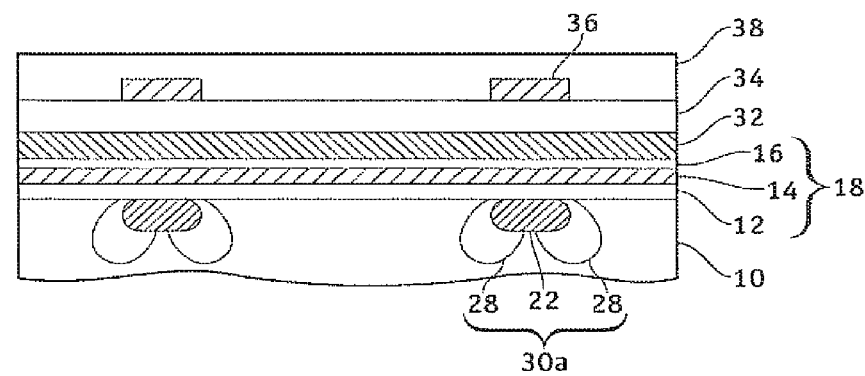
Figure 2:
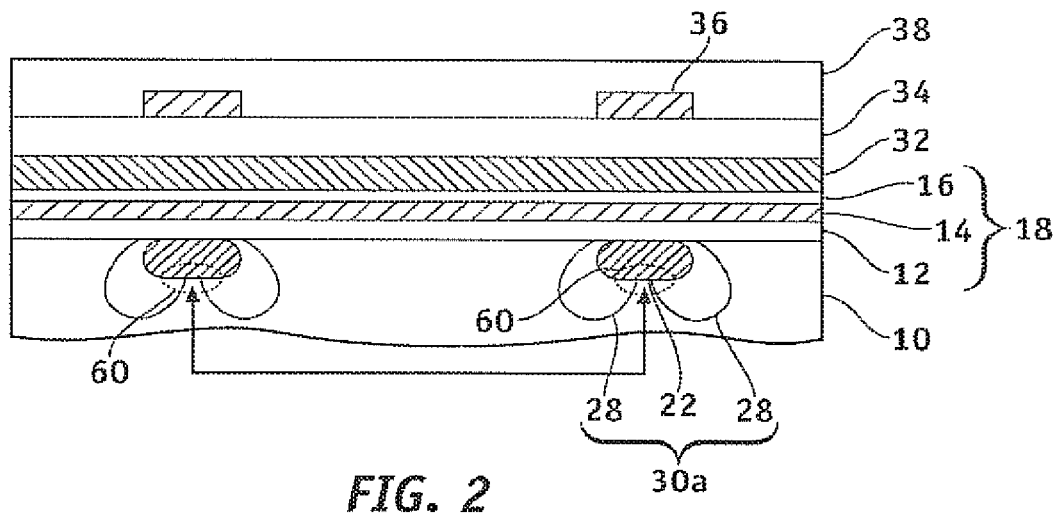
FIG. 2 is a cross-sectional diagram depicting a path through which junction current flows in the conventional device of FIGS. 1(*a*) to 1(*d*)

A description will now be given, with reference to FIG. 2, of factors in conventional semiconductor devices that generate a junction current when high voltage is applied between bit lines 30*a* (i.e., between a source region and a drain region) in a case where the bit line 30*a* is formed by high energy and high dosage ion implantation for the purpose of miniaturization of memory cells. FIG. 2 is a diagram showing the same cross-section as FIG. 1(*d*). In a bottom portion 60 of a high concentration diffusion region 22, the junction profile (impurities concentration profile) suddenly changes from an N-type high electric field diffusion region 22 to a P-type semiconductor substrate 10. Therefore, when a high voltage is applied between the bit lines 30*a*, the high electric field is applied to the bottom portion 60. Thus, the junction current flows between the bottom portions 60 of the high concentration diffusion regions 22, as indicated by the arrows.

In particular, when ion implantation is performed, a depletion layer between the bit lines 30*a* become closer because a P-type region that has a higher concentration than the semiconductor substrate 10 is formed between the bit lines 30*a* within the semiconductor substrate 10. Furthermore, because impurities reach deep within the semiconductor substrate 10 by ion implantation, the depletion layer between the bit lines 30*a* is even closer near the bottom portion, thereby further facilitating the flow of junction current near the bottom portion.

Figure 3:
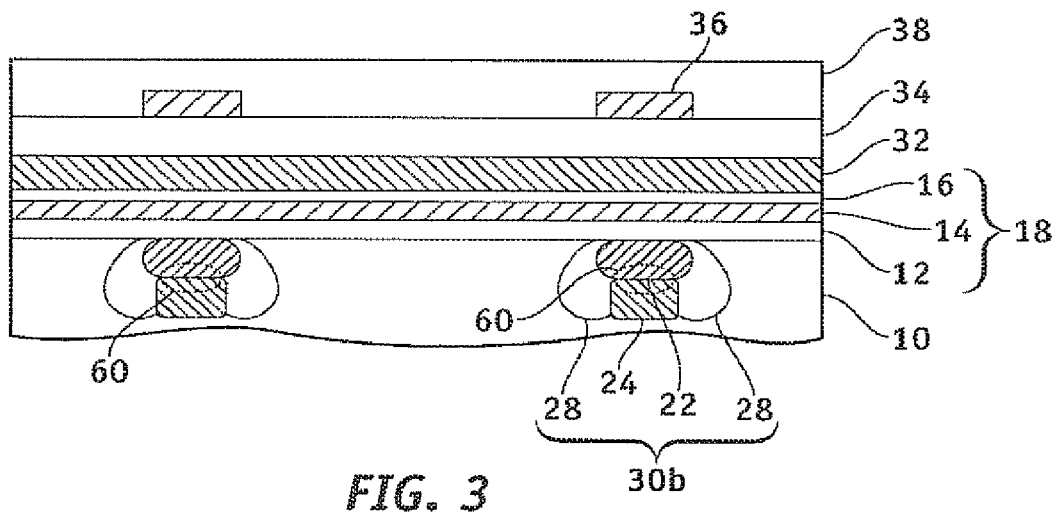
FIG. 3 is a cross-sectional diagram showing a semiconductor device in accordance with an embodiment of the present invention.

Thus, a first low concentration diffusion region that has a lower impurity concentration than the high concentration diffusion region 22 is formed under the high concentration diffusion region 22. A cross-sectional diagram in accordance with the present embodiment is shown in FIG. 3. This diagram is the same as FIG. 1(*d*), aside from bit line 30*b*. The first low concentration diffusion region 24 that has a lower impurity concentration than the high concentration diffusion region 22 is formed under the high concentration diffusion region 22, thereby forming a vertical-direction lightly doped drain (LDD) structure.

In this manner, the junction profile of the bottom portion of the high concentration diffusion region 22 is reduced. Therefore, when high voltage is applied between the bit lines 30*b*, the electric field of the bottom portion 60 of the high concentration diffusion region 22 is reduced. As a result, the flow of the junction current becomes poorer, and the source-drain breakdown voltage improves. Thus, when the high concentration diffusion region 22 is formed by high energy and high dosage ion implantation, a low-resistance bit line 30*b* can be formed. In addition, the distance between the bit lines 30*b* can be shortened. Consequently, the memory cells can be miniaturized. Hereinafter, the embodiments of the present invention are explained.

First Embodiment

Figure 4A:
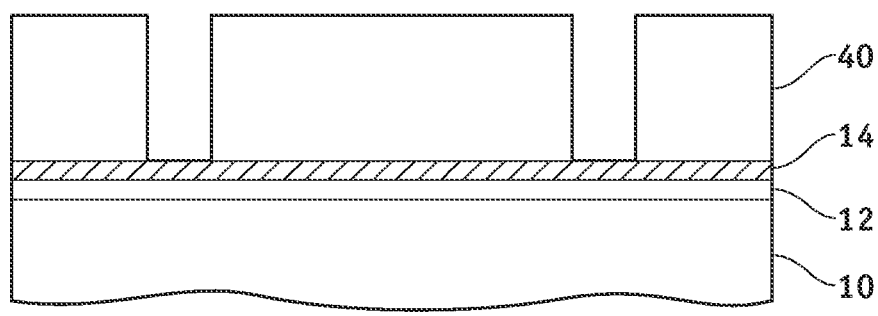
FIGS. 4(*a*) to 4(*c*) are respective cross-sectional diagrams showing a manufacturing method in accordance with the first embodiment of the present invention.
Figure 4B:
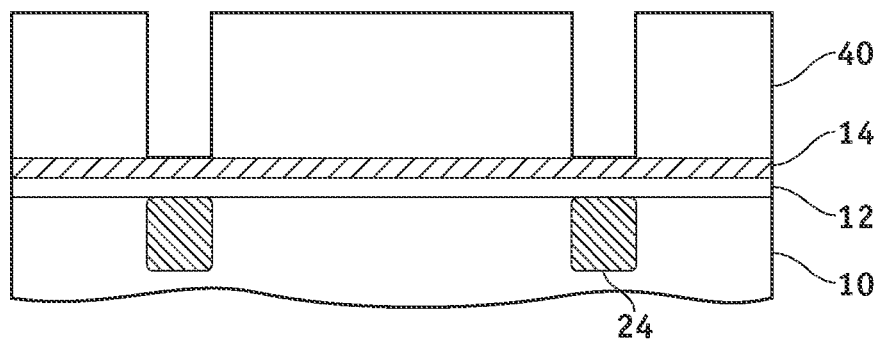

A first embodiment of the present invention is an example in which ion implantation is performed with a photoresist and a mask layer. FIGS. 4(*a*) through 4(*c*) are respective cross-sectional views of a word line in the horizontal direction of the bit line showing a manufacturing method in accordance with the first embodiment of the present invention. In FIG. 4(*a*), a tunnel oxide film 12 (silicon oxide film) is formed on a P-type silicon semiconductor substrate 10 (or a P-type region within the semiconductor substrate) using, for example, a thermal oxidization method, and a trap layer 14 (silicon nitride film) is formed using, for example, a chemical vapor deposition (CVD) method. A photoresist 40 is applied onto the trap layer 14, and an opening having a width of about 100 nm is formed using an ordinary exposure technique. In FIG. 4(b), an N-type first low concentration diffusion region 24 is formed by implanting arsenic in the semiconductor substrate 10 at, for example, an implantation energy of 60 keV and an implantation dosage of $1.0 \times 10^{13}$ cm$^{-2}$ with the photoresist 40 as a mask, the semiconductor device being subsequently treated thermally.

Next, in FIG. 4(c), the high concentration diffusion region 22 is formed on the first low concentration diffusion region 24 by implanting, for example, arsenic under conditions in which the implantation energy is 40 keV and the implantation dosage is $1.1 \times 10^{15}$ cm$^{-2}$, within the semiconductor substrate 10 with the same photoresist 40 as a mask, and subsequently performing heat-treatment thereto. At this time, the photoresist 40 is removed by ion irradiation of the ion implantation, the opening becoming 30 to 40 nm wider. Therefore, the width of the high concentration diffusion region 22 becomes wider than the first low concentration diffusion region 24. In addition, pocket implantation regions 28 are formed on both sides of the high concentration diffusion region 22, by implanting (pocket implantation) boron, for example, under conditions in which the implantation energy is 30 keV, the implantation dosage is $3.0 \times 10^{13}$ cm$^{-2}$, and the ion irradiation angle is 150 to the vertical line of the semiconductor substrate with the same photoresist 40 utilized as a mask, and subsequently performing heat-treatment thereto. From the foregoing, the bit line 30b that includes the high concentration diffusion region 22, the first low concentration diffusion region 24, and the pocket implantation region 28 which serves as the source region and the drain region is formed.

The photoresist 40 is removed and a top oxide film 16 (silicon oxide film) is formed using, for example, the CVD method. In this way, the ONO film 18 composed of the tunnel oxide film 12, the trap film 14, and the top oxide film 16 is formed on the semiconductor substrate 10. A polycrystalline silicon film is then formed and a predetermined area is removed using ordinary exposure and etching methods. In this way, a word line 32 that serves as a gate electrode is formed on the ONO film 18. Subsequently, the flash memory in FIG. 3 is completed by the formation of an interlayer insulating film 34, the formation of a wiring layer 36, and the formation of a protective film 38 using an ordinary technique.

In this flash memory, the ONO film 18 is provided on the semiconductor substrate 10 and the word line 32 serving as the gate electrode is provided on the ONO film 18. The semiconductor substrate 10 between the bit lines 30b functions as a channel and the ONO film 18 between the channel and the word line 32 stores electric charge and functions as a non-volatile memory. The charge storing region can be formed in two locations between the bit lines 30b under the word line 32 by switching the source region and the drain region. In other words, two charge storage regions are provided in the ONO film 18 between the bit lines 30b under the word line 32.

A semiconductor in accordance with the first embodiment includes the high concentration diffusion region 22 formed within the semiconductor substrate 10 and a first low concentration diffusion region 24 that has a lower impurity concentration than the high concentration diffusion region 22 and is provided under the high concentration diffusion region 22.

Furthermore, the bit line 30b that serves as the source region and the drain region includes the high concentration diffusion region 22 and the first low concentration diffusion region 24. In this manner, by the implementation of the vertical LDD structure and the provision of the first low concentration diffusion region 24 under the high concentration diffusion region 22, the junction profile of the bottom portion 60 of the high concentration diffusion region 22 can be reduced. In addition, the electric field of the bottom portion 60 does not become high, even when high voltage is applied between the bit lines 30b, thereby suppressing the junction current between the bottom portions 60 and improving the source-drain breakdown voltage. From the foregoing, it can be seen that the high concentration diffusion region 22 can be formed by high energy, high dosage ion implantation. In addition, the distance between the bit lines 30b can be shortened, thereby miniaturizing the memory cells.

In addition, the pocket implantation regions 28 (to which pocket implantation has been performed) are provided on both sides of the high concentration diffusion region 22, the bit line 30b including the pocket implantation regions 28. When there are pocket implantation regions 28, writing characteristics are improved and the junction current becomes prominent, as explained previously. However, by the provision of the first low concentration diffusion region 24, the junction current can be suppressed and the source-drain breakdown voltage can be improved even when there are the pocket implantation regions 28, enabling miniaturization of the memory cells.

Also, the width of the first low concentration diffusion region 24 is narrower than the high concentration diffusion region 22. Therefore, the improvement in the writing characteristics due to the pocket implantation can be maintained while suppressing the junction current from the bottom portion of the high concentration diffusion region 22.

Figure 4C:
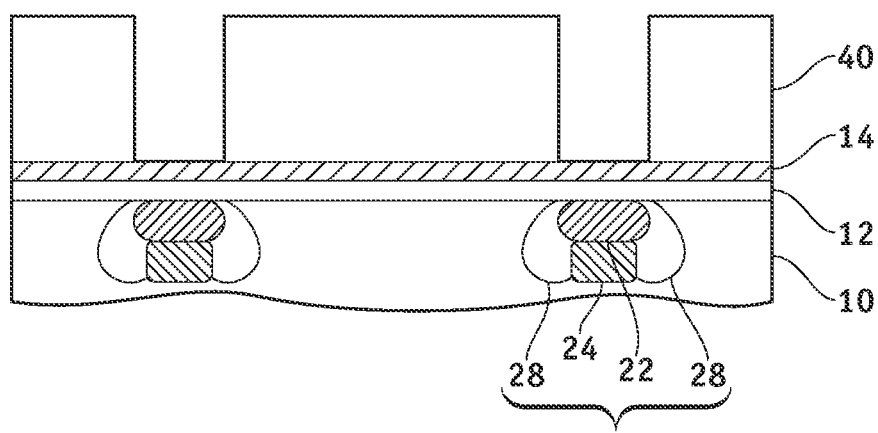

As in FIG. 4(c), in the photoresist 40 used as the mask layer, the opening therein is expanded by ion implantation because the ion implantation for forming the high concentration diffusion region 22 is performed in an extremely high dosage of, for example, $1.1 \times 10^{15}$ cm$^{-3}$ or more. Thus, the photoresist 40 is removed by the ion irradiation during the ion implantation step and the opening in the photoresist 40 is expanded.

At the same time, the ion implantation for forming the low concentration diffusion region 24 is, for example, about $1 \times 10^{13}$ cm$^{-3}$ and the photoresist 40 is barely removed, while the opening is barely expanded. Therefore, first, the ion implantation for forming the first low concentration diffusion region 24 is performed and, subsequently, the ion implantation for forming the high concentration diffusion region 22 is performed. In this manner, the width of the high concentration diffusion region can be wider than the width of the first low concentration diffusion region 24.

Furthermore, in addition to the dosage of the pocket implantation being about $3 \times 10^{13}$ cm$^{-3}$, the boron that is the implanted ion has a smaller ion radius than arsenic and, therefore, little of the photoresist 40 is removed, even when the dosage is large. Thus, the pocket implantation is preferably performed after the formation of the high concentration diffusion region 22 because, if the pocket implantation is performed first, arsenic is implanted, even into the pocket implantation region, during the formation of the high concentration diffusion region 22.

Accordingly, the first low concentration diffusion region 24, the high concentration diffusion region 22, and the pocket implantation region 28 can be formed using the same photoresist 40. Advantageously, the first low concentration diffusion region 24 can be formed merely by the addition to the conventional manufacturing method of the step of ion implantation to form the first low concentration diffusion region 24.

Second Embodiment

Figure 5A:
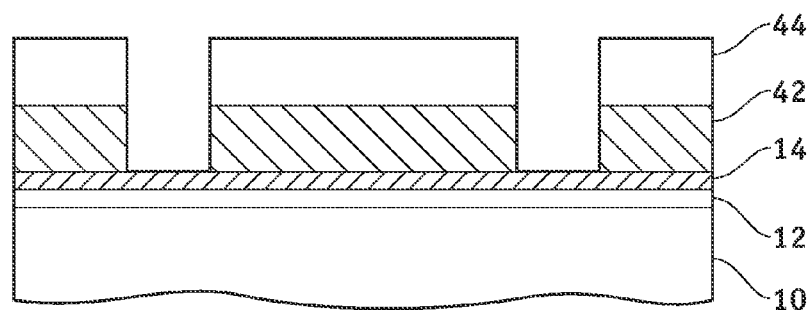
FIGS. 5(*a*) to 5(*d*) are respective cross-sectional diagrams showing semiconductor device and a manufacturing method therefor in accordance with a second embodiment of the present invention.

A semiconductor device in accordance with a second embodiment of the present invention is an example of a semiconductor device wherein the ion implantation is performed using an insulating film as the mask layer. FIGS. 5(a) through 5(d) are respective cross-sectional views of the word line in the width direction of the bit line showing a manufacturing method in accordance with the second embodiment of the present invention. Referring to FIG. 5(a), the tunnel oxide film 12 and the trap layer 14 are formed on the semiconductor substrate 10 as in accordance with the first embodiment. A silicon oxide film, for example, is formed on the trap layer 14 as a mask layer 42 using a CVD method. A photoresist 44 is applied and an opening having a width of about 100 nm is formed using an ordinary exposure technique. The mask layer 42 is then etched with the photoresist 44 as the mask.

Figure 5B:
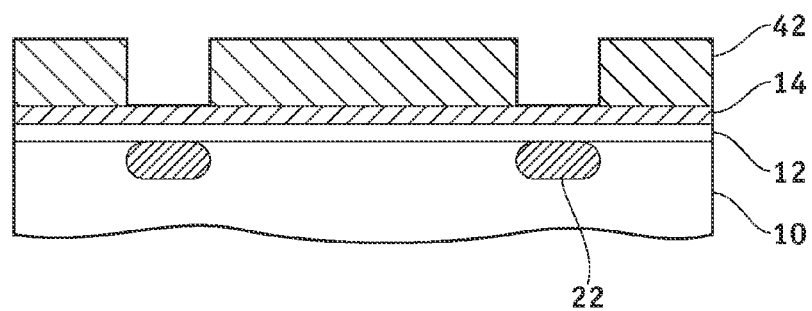

In FIG. 5(b), the photoresist 44 is removed. The high concentration diffusion region 22 is formed by implanting arsenic, for example, at an implantation energy of 40 keV and an implantation dosage of $1.1 \times 10^{15}$ cm$^2$ with the mask layer 42 as a mask, and is subsequently treated thermally.

Figure 5C:
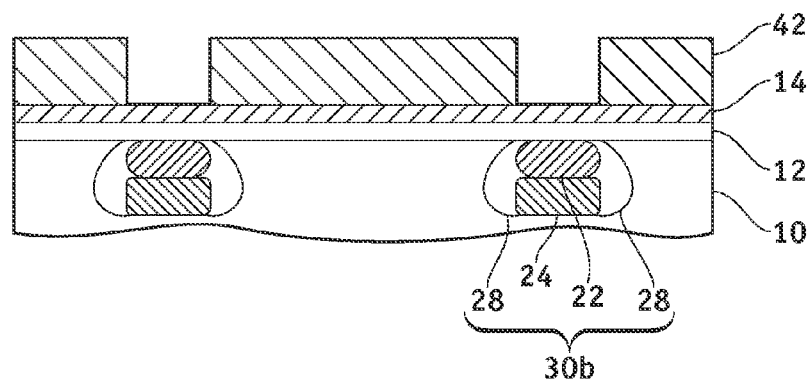

Next, in FIG. 5(c), arsenic, for example, is implanted at an implantation energy of 60 keV and an implantation dosage of $1.0 \times 10^{13}$ cm$^{-2}$, with the same mask layer 42 as a mask and, subsequently, heat treated. The first low concentration diffusion region 24 is thereby formed below the high concentrate diffusion region 22. In addition, boron, for example, is implanted (pocket implantation) under conditions in which the implantation energy is, for example, 30 keV, the implantation dosage is $3.0 \times 10^{13}$ cm$^{-2}$, and the ion irradiation angle is 15° to the vertical line of the semiconductor substrate, with the same mask layer 42 as a mask and, subsequent thereto, heat-treatment is performed. Pocket implantation regions 28 are thus formed on both sides of the high concentration diffusion region 22. From the foregoing, the bit line 30b that includes the high concentration diffusion region 22, the first low concentration diffusion region 24 and the pocket implantation region 28 is formed and serves as the source region and the drain region.

Figure 5D:
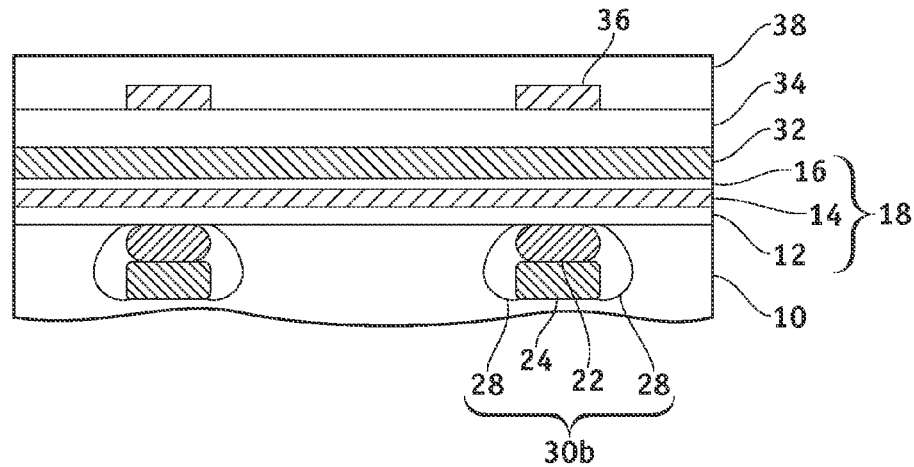

In FIG. 5(d), the mask layer 42 is removed. Thereafter, the flash memory in FIG. 3 is completed by the formation of the word line 32, the interlayer insulating film 34, the wiring layer 36, and the protective film 38, as in accordance with the first embodiment.

In accordance with the second embodiment, the vertical direction LDD structure is implemented and the first low concentration diffusion region 24 is provided under the high concentration diffusion region 22. Therefore, the junction current between the bottom portions can be suppressed and the source-drain breakdown voltage can be improved. Thus, miniaturization of the memory cells becomes possible. Furthermore, even with the pocket implantation regions 28, the junction current between the bottom portions can be controlled and the source-drain breakdown voltage can be improved.

Although the silicon oxide film is used as the mask layer 42, any material in which the opening of the mask layer 42 does not expand due to ion implantation can be used. The mask layer 42 is preferably a material that can acquire selectivity with the trap layer 14. For example, through the use of the silicon oxide film, such as in accordance with the second embodiment, selectivity with the silicon nitride film that is the trap layer 14 can be acquired.

In accordance with the second embodiment, the width of the high concentration diffusion region 22 and the width of the first low concentration diffusion region 24 can be made approximately equal by the use of the mask layer 42 of insulating film. In this manner, the first concentration diffusion region 24 can be formed over the entire bottom surface of the high concentration diffusion region 22. Thus, the flow of the junction current can be suppressed more effectively.

When improvement in the writing characteristics is prioritized by making the width of the low concentration diffusion region 24 narrower than that of the high concentration diffusion region 22, as in accordance with the first embodiment, the effect of the pocket implantation is further maintained and the writing characteristics can be improved. At the same time, when the suppression of the junction current is prioritized by making the width of the low concentration diffusion region 24 and the high concentration diffusion region 22 approximately equal as in accordance with the second embodiment, the junction current can be further suppressed.

Third Embodiment

Figure 6A:
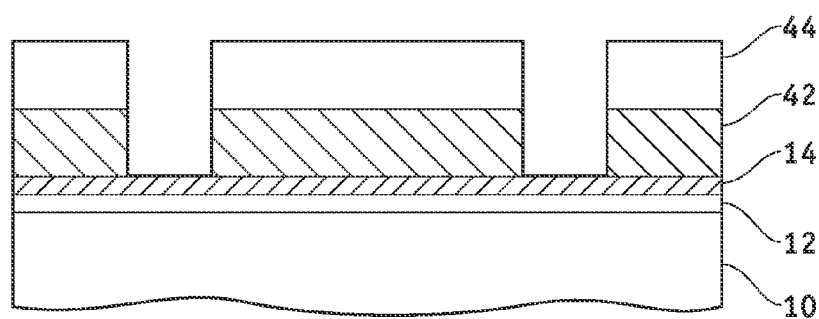
FIGS. 6(*a*) to 6(*d*) are respective first cross-sectional diagrams showing a semiconductor device and a manufacturing method therefor in accordance with a third embodiment of the present invention.

A third embodiment is an example of a semiconductor device in which side walls are formed and ion implantation is performed using the insulating film as the mask layer. FIGS. 6(a) to 6(d) and FIGS. 7(a) to 7(c) are respective cross-sectional views of the word line in the horizontal direction of the bit line, showing a manufacturing method in accordance with the third embodiment of the present invention. In FIG. 6(a), the tunnel oxide film 12 and the trap layer 14 are formed on the semiconductor substrate 10, as in accordance with the second embodiment. A silicon oxide layer, for example, is formed on the trap layer 14 as the mask layer 42, using, for example, the CVD method. The photoresist 44 is applied and an opening having a width of about 100 nm is formed using an ordinary exposure technique. The mask layer 42 is then etched with the photoresist 44 as the mask.

Figure 6B:
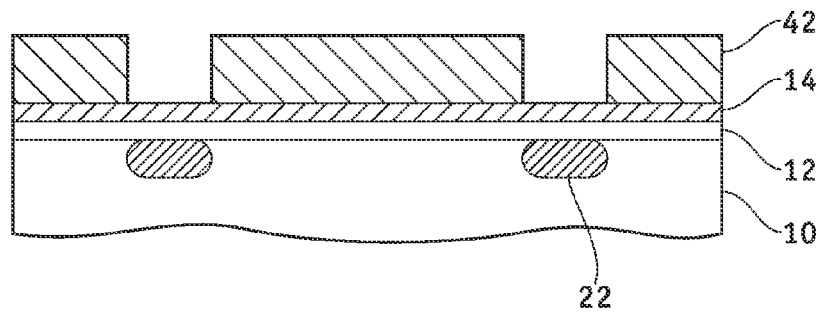
Figure 6C:
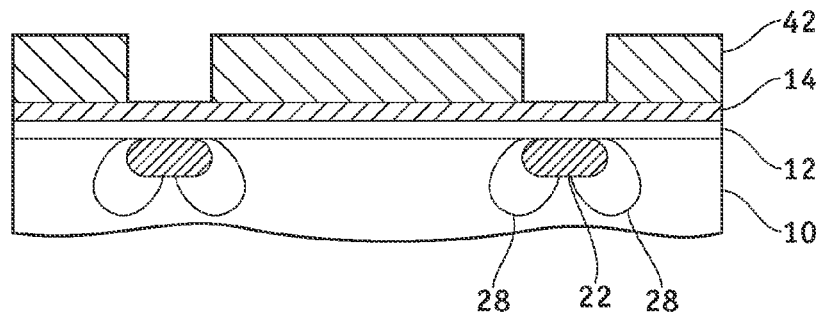

In FIG. 6(b), the photoresist 44 is removed and the high concentration diffusion region 22 is formed with the mask layer 42 as the mask, as in accordance with the second embodiment. In FIG. 6(c), the pocket implantation regions 28 are formed on both sides of the high concentration diffusion region 22, as in accordance with the second embodiment, with the same mask layer 42 as the mask.

Figure 6D:
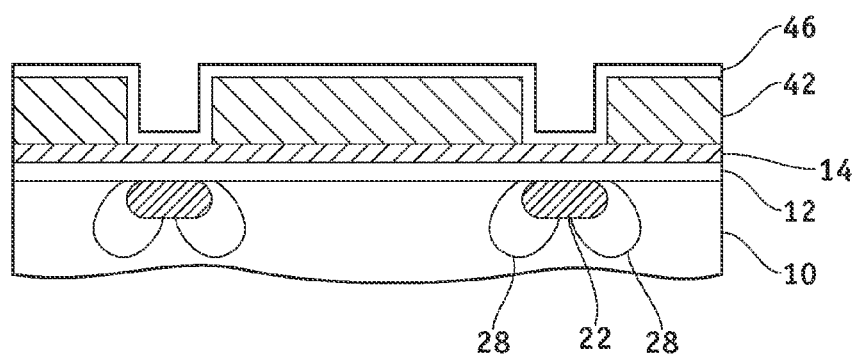
Figure 7A:
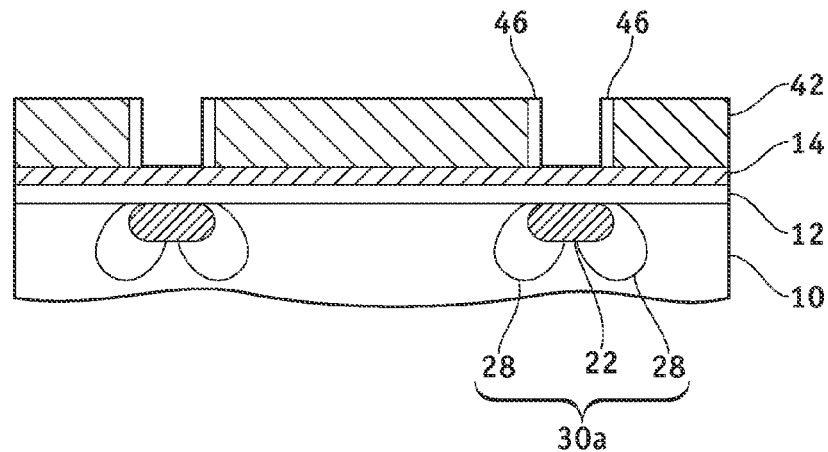
FIGS. 7(*a*) to 7(*c*) are respective second cross-sectional diagrams showing a semiconductor device and a manufacturing method therefor in accordance with the third embodiment of the present invention.

In FIG. 6(d), for example, the silicon oxide film having a film thickness of 20 nm is formed on the mask layer 42. In FIG. 7(a), side walls 46 are formed on both sides of the mask layer 42 by etching the entire surface. The width of the side walls is about 20 nm.

Figure 7B:
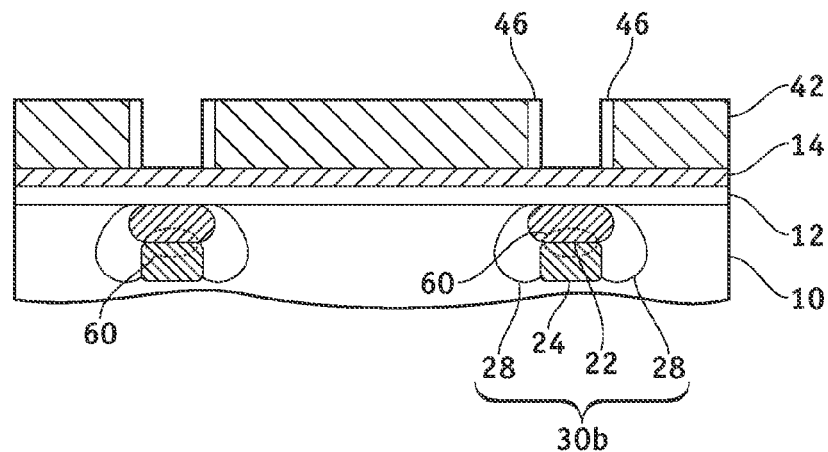

Next, in FIG. 7(b), arsenic, for example, is implanted at an implantation energy of 60 keV and an implantation dosage of $1.0 \times 10^{13}$ cm$^{-2}$ with the mask layer 42 as a mask, and is subsequently treated thermally. The first low concentration diffusion region 24 that has a lower impurity concentration than the high concentration diffusion region 22 is thus formed under the high concentration diffusion region 22. From the foregoing, the bit line 30b that includes the high concentration diffusion region 22, the first low concentration diffusion region 24, and the pocket implantation region 28 serving as the source region and the drain region is formed.

Figure 7C:
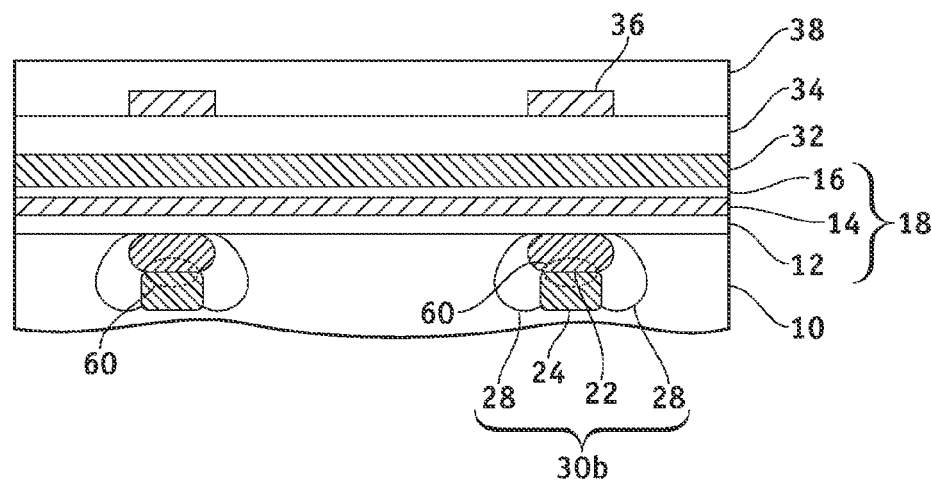

In FIG. 7(c), a mask layer 40 and the side walls 46 are removed. The top oxide film 16 is formed on the trap layer 14 and the ONO film 18 is formed. Subsequently, the flash memory in accordance with the third embodiment is completed by the formation of the word line 32, the interlayer insulating film 34, the wiring layer 36, and the protective film 38, as in accordance with the first embodiment.

In accordance with the third embodiment, the vertical direction LDD structure is implemented and the first low concentration diffusion region 24 is provided under the high concentration diffusion region 22, as in accordance with the first embodiment. As a result of this vertical LDD structure, the junction current between the bottom portions can be suppressed and the source-drain breakdown voltage can be improved. Thus, miniaturization of memory cells becomes possible. Furthermore, even when there are pocket implantation regions 28, the junction currents between the bottom portions can be suppressed and the source-drain breakdown voltage can be improved.

In addition, through the use of the silicon oxide film as the mask layer 42, the side walls 46 can be formed on both sides of the mask layer 42, through the high temperature side wall formation step. Aside from silicon oxide film, the mask layer 42 can be any material that can withstand the heat treatment during the formation of the side walls 46. For example, insulation film and metal can be used. In addition, when removing, the mask layer 42 and the side walls 46 are preferably materials that can acquire selectivity with the trap layer 14. For example, through the use of the silicon oxide film as in accordance with the third embodiment, selectivity with the silicon nitride film that is the trap layer 14 can be acquired.

In accordance with the third embodiment, the high concentration diffusion region 22 is formed by ion implantation with the mask layer 42 as the mask, the side walls 46 are formed on the side sections of the mask layer 42, and the first low concentration diffusion region 24 is formed by ion implantation with the mask layer 42 and the side wall 46 as the mask. In this manner, the width of the first low concentration region 24 can be made narrower than that of the high concentration diffusion region 22, as in accordance with the first embodiment. Thus, the effect of the pocket implantation can be maintained, while suppressing the junction current from the bottom portion of the high concentration diffusion region 22.

In accordance with the first embodiment, the width of the opening of the photoresist 40 that is the mask layer is expanded by the ion implantation step for forming the high concentration diffusion region 22, and the width of the high concentration diffusion region 22 is determined by this width. In this case, there is fluctuation in the expansion of the photoresist 40, and the width of the high concentration diffusion region 22 fluctuates. In addition, the amount of expansion of the photoresist 40 varies with the implantation condition and, therefore, it is difficult to arbitrarily decide the shift amount of the high concentration diffusion region 22 and the first low concentration diffusion region 24.

At the same time, in accordance with the third embodiment, the high concentration diffusion region 22 can be formed by ion implantation with the mask layer 42 as the mask, such that the width thereof is formed with favorable controllability. In addition, through the use of the side walls 46, the width of the first low concentration diffusion region 24 can be formed accurately. Therefore, the widths of both the high concentration diffusion region 22 and the first low concentration diffusion region can be accurately formed, thereby suppressing the fluctuation of the transistor characteristics. In addition, through arbitrary decision of the width of the side walls 46, the shift amounts of the high concentration diffusion regions 22 and the first low concentration diffusion regions 24 can be decided arbitrarily. Thus, design in accordance with desired transistors is possible.

As explained previously, when the reduction of manufacturing steps is prioritized, manufacturing in accordance with the first embodiment is preferable. On the other hand, if the suppression of the fluctuation in the transistor characteristics and design enhancement are prioritized, manufacturing in accordance with the third embodiment is preferable.

Fourth Embodiment

Figure 8A:
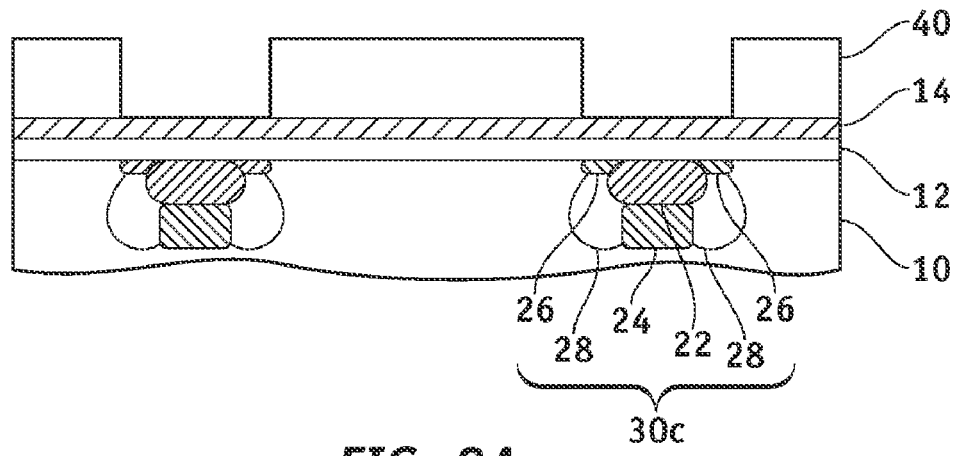
FIGS. 8(*a*) and 8(*b*) are respective cross-sectional diagrams showing a semiconductor device and a manufacturing method therefor in accordance with a fourth embodiment of the present invention.
Figure 8B:
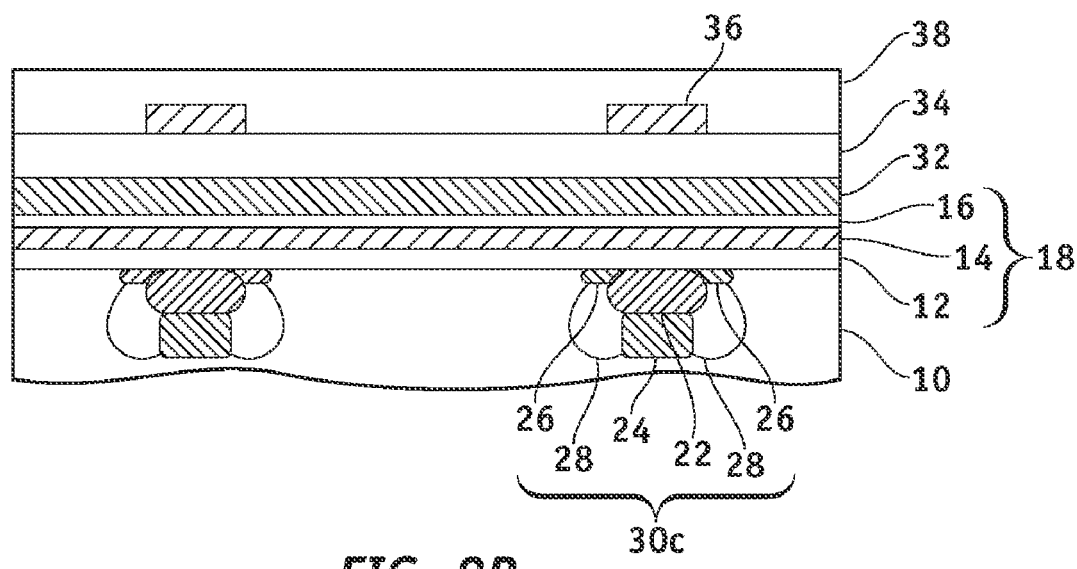

A fourth embodiment is an example of a semiconductor device in which second low concentration diffusion regions are formed on both sides of the high concentration diffusion region. FIGS. 8(a) and 8(b) are respective cross-sectional views of the word line in the width direction of the bit line, showing a manufacturing method in accordance with the fourth embodiment of the present invention. In FIG. 8(a), after the steps depicted in FIGS. 4(a) to 4(c) in accordance with the first embodiment are performed, ashing, for example, is performed and the width of the opening of the photoresist that is the mask layer 40 is expanded by 15 nm. Phosphorus, for example, is then implanted at an implantation energy of 25 keV and an implantation dosage of $1.0 \times 10^{14}$ $cm^{-2}$ with the photoresist 40 (mask layer) as a mask, and is subsequently treated thermally. The N-type second low concentration diffusion regions 26 that have a lower impurity concentration than the high concentration 22 diffusion region are then formed on both sides of the high concentration diffusion region 22, above the pocket implantation regions 28. From the foregoing, a bit line 30c that includes the high concentration diffusion region 22, the first low concentration diffusion region 24, the second low concentration diffusion regions 26, and the pocket implantation region 28 is formed and serves as the source region and the drain region.

Referring to FIG. 8(b), the photoresist 40 is removed. The top oxide film 16 is formed on the trap layer 14, and the ONO film 18 is formed. Subsequently, a flash memory in accordance with the fourth embodiment can be completed by the formation of the word line 32, the interlayer insulating film 34, the wiring layer 36, and the protective film 38, as in accordance with the first embodiment.

In accordance with the fourth embodiment, in addition to the vertical direction LDD structure that is the same as that in accordance with the first embodiment, a horizontal direction LDD structure is implemented and the second low concentration diffusion regions 26 are provided on both sides of the high concentration diffusion region 22. In this manner, the junction profile of the side sections of the high concentration diffusion region 22 can be reduced. Therefore, even when high voltage is applied between the bit lines 30c, the electric field of the side sections does not become high. Thus, the junction current between the bottom portions of the high concentration diffusion region 22 can be suppressed in addition to suppressing the junction current between the side sections, thereby further improving the source-drain breakdown voltage.

Furthermore, the width of the first low concentration diffusion region 24 can be made narrower than that of the high concentration diffusion region 22. Thus, the effect of the pocket implantation can be maintained while suppressing the junction current from the bottom part of the high concentration diffusion region 22.

Furthermore, the first low concentration diffusion region 24, the high concentration diffusion region 22, the pocket implantation regions 28, and the second low concentration diffusion regions 26 can be formed using the same photoresist 40. Therefore, the second low concentration diffusion regions 24 can be formed merely by the addition of the step of expanding the opening of the photoresist 40 and the ion implantation step of forming the second low concentration diffusion regions 24 in accordance with the first embodiment. Thus, an increase in manufacturing steps can be reduced.

Fifth Embodiment

A fifth embodiment is an example of a semiconductor device in which the second low concentration diffusion regions are formed on both sides of the high concentration diffusion region using an insulating film mask. FIGS. 9(a) through 9(d) are respective cross-sectional views of the word line in the width direction of the bit line, showing a manufacturing method in accordance with the fifth embodiment of the present invention.

Figure 9A:
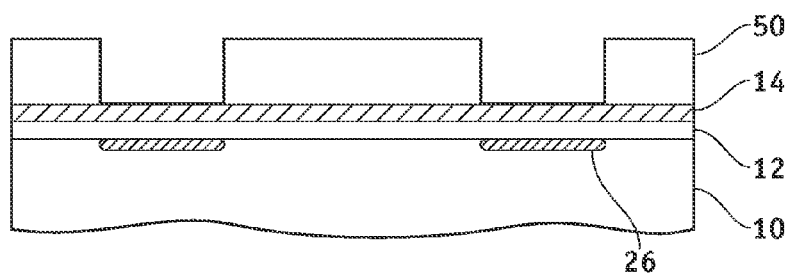
FIGS. 9(*a*) to 9(*d*) are respective cross-sectional diagrams showing a semiconductor device and a manufacturing method therefor in accordance with a fifth embodiment of the present invention.

Referring to FIG. 9(a), the tunnel oxide film 12 and the trap layer 14 are formed on the semiconductor substrate 10, as in accordance with the first embodiment. A silicon oxide film, for example, is formed on the trap layer 14 as a mask layer 50 using a CVD method. Openings that have a width of 130 nm are formed in the mask layer 50 using an ordinary exposure technique and an etching technique. The second low concentration diffusion regions 26 are formed by implanting phosphorus, for example, at an implantation energy of 25 keV and an implantation dosage of $1.0 \times 10^{14}$ cm$^{-2}$ with the mask layer 50 as the mask, and is subsequently treated thermally.

Figure 9B:
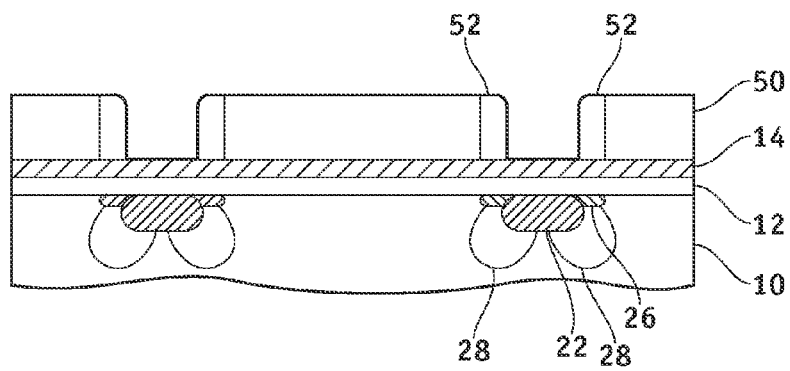

Next, in FIG. 9(b), side walls 52 composed of silicon oxide film, for example, having a width of 15 nm is formed on both sides of the mask layer 50. Arsenic, for example, is implanted at an implantation energy of 40 keV and an implantation dosage of $1.1 \times 10^{15}$ cm$^{-2}$ with the mask layer 50 and the side walls 52 as the mask, and is subsequently treated thermally. The high concentration diffusion region 22 is thus formed between the second low concentration diffusion regions 26. Furthermore, boron, for example, is implanted (pocket implantation) at an implantation energy of 30 keV, an implantation dosage of $3.0 \times 10^{14}$ cm$^{-2}$, and an ion irradiation angle of 15° to the vertical line of the semiconductor substrate, with the mask layer 50 and the side walls 52 as the mask, and is subsequently treated thermally. The pocket implantation regions 28 are thereby formed on both sides of the high concentration diffusion region 22, under the second low concentration diffusion regions 26.

Figure 9C:
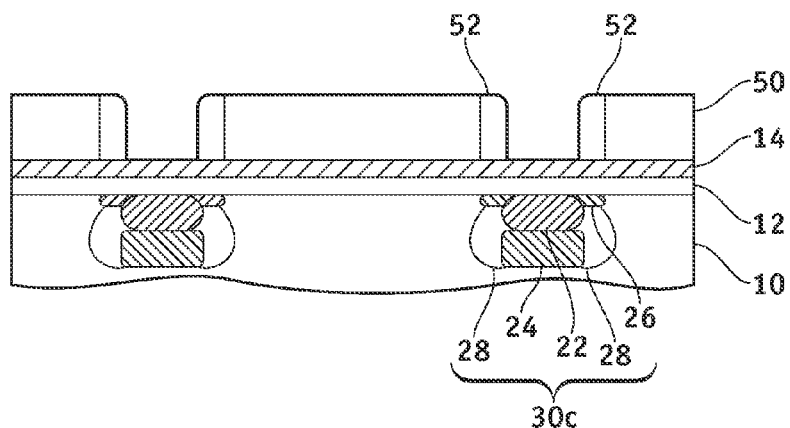

In FIG. 9(c), arsenic, for example, is implanted at an implantation energy of 60 keV and an implantation dosage of $1.0 \times 10^{13}$ cm$^{-2}$ with the mask layer 50 and the side walls 52 as the mask, and is subsequently treated thermally. The first low concentration diffusion region 24 is thus formed under the high concentration diffusion region 22. From the foregoing, the bit line 30c that includes the high concentration diffusion region 22, the first low concentration diffusion region 24, the second low concentration diffusion regions 26, and the pocket implantation regions 28 is formed and serves as the source region and the drain region.

Figure 9D:
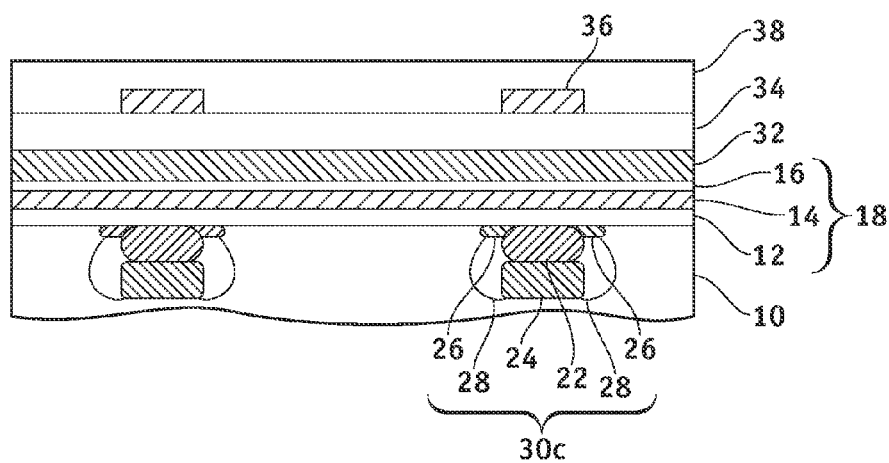

In FIG. 9(d), the mask layer 50 and the side walls 52 are removed. Subsequently, the flash memory in accordance with the fifth embodiment is completed by the formation of the word line 32, the interlayer insulating film 34, the wiring layer 36, and the protective film 38, as in accordance with the first embodiment.

In accordance with the fifth embodiment, the second concentration diffusion regions 26 are provided on both sides of the high concentration diffusion region 22 as the horizontal direction LDD structure in addition to the vertical direction LDD structure, as in accordance with the fourth embodiment. Thus, the junction current between the side sections, in addition to a junction leak current between the bottom portions of the high concentration diffusion region 22, can be suppressed and the source-drain breakdown voltage can be improved.

Furthermore, through the step of ion implantation using an insulating film or metal mask layer 50 and side walls 52, the width of the high concentration diffusion region 22 can be made approximately equal to the width of the first low concentration diffusion region 24. In this manner, the first low concentration diffusion region 24 can be formed over the bottom portion of the high concentration diffusion region 22. Thus, the flow of the junction current can be more effectively suppressed.

Furthermore, through the formation of the second low concentration diffusion regions 26 with the insulating film or metal mask layer 50 as the mask, the width of the second low concentration diffusion regions 26 can be formed accurately. Furthermore, the side walls 52 are provided on both sides of the mask layer 50 and the high concentration diffusion region 22 and the first low concentration diffusion region 24 are formed. Therefore, the widths of the high concentration diffusion region 22 and the first low concentration diffusion region 24 can be accurately formed. Thus, the fluctuation in the transistor characteristics can be suppressed enabling desired transistor designs.

Sixth Embodiment

Figure 10A:
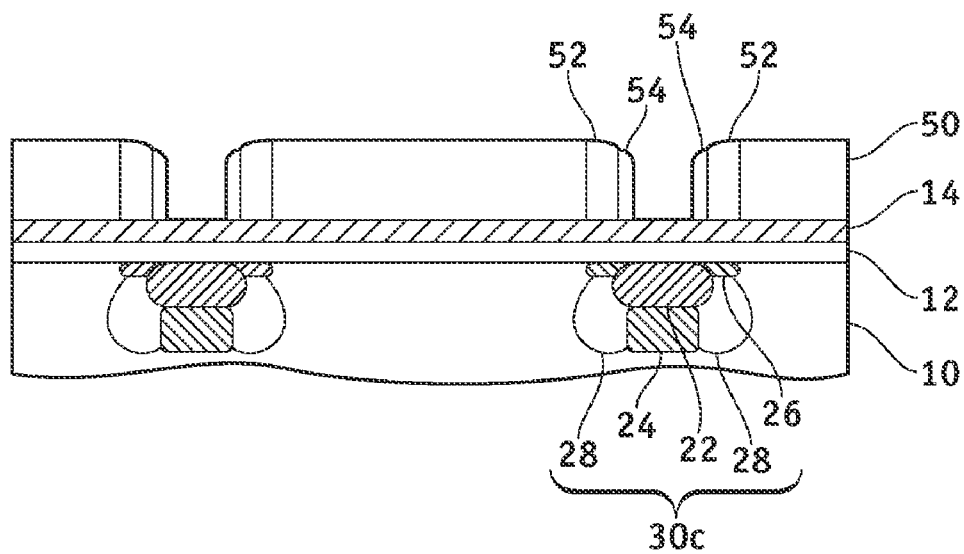
FIGS. 10(*a*) and 10(*b*) are respective cross-sectional diagrams showing a semiconductor device and a manufacturing method therefor in accordance with a sixth embodiment of the present invention.
Figure 10B:
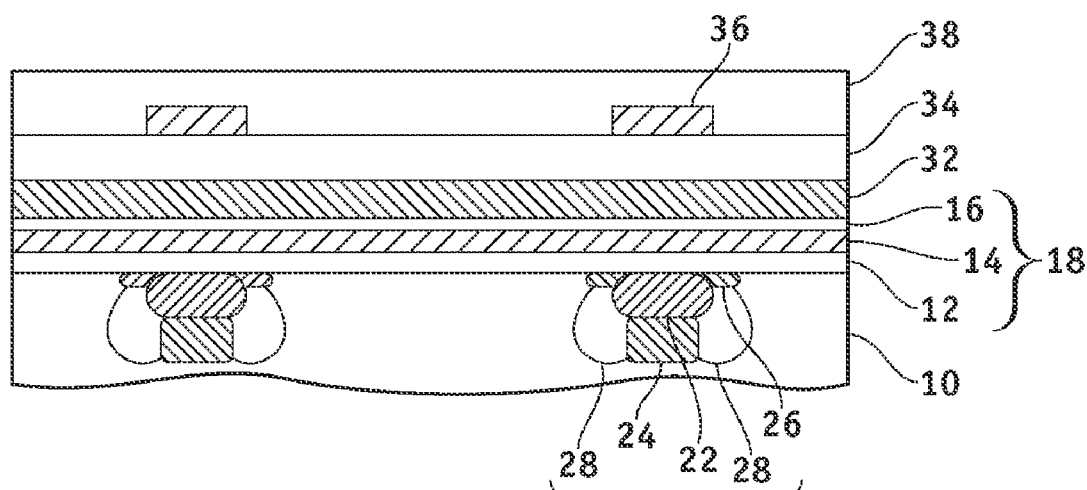

A sixth embodiment is an example of a semiconductor device in which the second low concentration diffusion regions are formed on both sides of the high concentration diffusion region using an insulating film mask. FIGS. 10(a) and 10(b) are respective cross-sectional views of the word line in the width direction of the bit line, showing a manufacturing method in accordance with the sixth embodiment of the present invention. In FIG. 10(a), after the steps of FIGS. 9(a) and 9(b) in accordance with the fifth embodiment are performed, side walls 54 that are composed of, for example, silicon oxide with a film thickness of 20 nm are formed on both sides of the side walls 52. Ion implantation is performed with the mask layer 50, the side walls 52, and the side walls 54 as the mask, and subsequently, heat-treatment is performed thereto. The first low concentration diffusion region 24 is thus formed. From the foregoing, the bit line 3c that includes the high concentration diffusion region 22, the first low concentration diffusion region 24, the second low concentration diffusion regions 26, and the pocket implantation regions 28 is formed and serves as the source region and the drain region.

In FIG. 10(b), the mask layer 50, the side walls 52, and the side walls 54 are removed. Subsequently, the flash memory in accordance with the sixth embodiment is completed by the formation of the word line 32, the interlayer insulating film 34, the wiring layer 36, and the protective layer 38, as in accordance with the first embodiment.

In accordance with the sixth embodiment, the second concentration diffusion regions 26 are provided on both sides of the high concentration diffusion region 22 as the horizontal direction LDD structure, in addition to the vertical direction LDD structure, as in accordance with the fourth embodiment and the fifth embodiment. Thus, the junction current between the side sections, in addition to a junction leak current between the bottom portions of the high concentration diffusion region 22, can be suppressed, and the source-drain breakdown voltage can be improved.

The high concentration diffusion region 20 is formed by the ion implantation with the mask layer 50 and the side walls 52 as the mask; in addition, the side walls 54 are provided on both sides of the side walls 52, and the first low concentration diffusion region 24 is formed by ion implantation with the side walls 54 as the mask. Through this, the width of the first low concentration diffusion region 24 can be made narrower than that of the high concentration diffusion region 22, as in accordance with the first embodiment. Thus, the effect of the pocket implantation can be maintained, while suppressing the junction leak current from the bottom portion of the high concentration diffusion region 22.

Furthermore, through the formation of the second low concentration diffusion regions 26 with the insulating film or metal mask layer 50 as the mask, the width of the second low concentration diffusion regions 26 can be formed accurately. Furthermore, the side walls 52 are provided on both sides of the mask layer 50, the high concentration diffusion region 52 is formed, thereby permitting accurate formation of the width of the high concentration diffusion region 22. Furthermore, the side walls 54 are provided on both sides of the side walls 52, the first low concentration diffusion region 24 is formed, thereby permitting accurate formation of the first low concentration diffusion region 24. Thus, the fluctuation in the transistor characteristics can be suppressed and desired transistor designs become possible.

In accordance with the fourth to sixth embodiments, the junction current can be suppressed and the source-drain breakdown voltage can be improved by the second low concentration diffusion regions 26. However, the impurity concentration profile of the side sections of the high concentration diffusion region 22 is reduced and the electric field occurring when voltage is applied between the source region and the drain region is also reduced. Thus, this is disadvantageous to a writing operation in which electrons that have become high energy are implanted in the trap layer 14 within the ONO film 18. At the same time, in accordance with the first to third embodiment, the impurity concentration profile of the side sections of the high concentration diffusion region 22 is steep, and favorable writing characteristics can be obtained.

Therefore, when the improvement of the source-drain breakdown voltage is prioritized, the use of the first to third embodiments is preferable. On the other hand, when the improvement of the writing characteristics is prioritized, the use of the fourth to sixth embodiments is preferable.

Although embodiments of the present invention have been explained above, the present invention is not limited to the specific embodiments described, and various changes and modifications can be made without departing from the principles and spirit of the invention, the scope of which is defined in the claims hereinbelow. For example, in a flash memory in accordance with the first to sixth embodiments, the ONO film 18 is provided on the semiconductor substrate 10, the word line 32 including a gate electrode is provided on the ONO film 18, and the charge storage regions are present in two locations within the ONO film 18, between the bit lines 30b and 30c, under the word line 32. Even if the configuration is not as such, if a semiconductor device has a bit line with the bit line structure of the present invention, serving as the source region and the drain region, and is formed within the semiconductor substrate, the effects of the present invention can be achieved.

The invention claimed is:

1. A semiconductor device comprising:
   a semiconductor substrate;
   a high concentration diffusion region formed in the semiconductor substrate and comprising first impurities implanted in the semiconductor substrate to a first depth from an upper face of the semiconductor substrate, the high concentration diffusion region having a first width measured orthogonal to the first depth thereof;
   a first low concentration diffusion region formed only under the high concentration diffusion region and comprising the first impurities implanted at a lower concentration than the high concentration diffusion region, the first low concentration diffusion region comprising the lower concentration of the first impurities implanted in the semiconductor substrate to a second depth from the upper face of the semiconductor substrate, the first low concentration diffusion region having a second width measured orthogonal to the second depth thereof;
   a first bit line formed in the semiconductor substrate and including a source region and a drain region, the first bit line including the high concentration diffusion region and the first low concentration diffusion region; and
   second low concentration diffusion regions formed on each side of the high concentration diffusion region, the second low concentration diffusion regions each implanted to a third depth from the upper face of the semiconductor substrate, wherein the third depth is less than the first depth.

2. The semiconductor device as claimed in claim 1, further comprising pocket ion implantation regions formed at both sides of the high concentration diffusion region and comprising second impurities different from the first impurities of the high concentration diffusion region and the first low concentration diffusion region, the pocket ion implantation regions included in the first bit line.

3. The semiconductor device as claimed in claim 1, wherein the second width of the first low concentration diffusion region is less than the first width of the high concentration diffusion region.

4. The semiconductor device as claimed in claim 1, wherein the second width of the first low concentration diffusion region is substantially equal to the first width of the high concentration diffusion region.

5. The semiconductor device as claimed in claim 1, the second low concentration diffusion regions further comprising third impurities implanted in the semiconductor substrate at a lower concentration of impurities than the first impurities of the high concentration diffusion region, wherein the third impurities are different from the first impurities of the high concentration diffusion region and the first low concentration diffusion region, wherein the second low concentration diffusion regions are included in the bit line and wherein the third depth of the second low concentration diffusion regions is substantially less than the first depth of the high concentration diffusion region such that the second low concentration regions do not physically touch the first low concentration region.

6. The semiconductor device as claimed in claim 1, further comprising:
   an ONO film provided on the semiconductor substrate; and
   a word line provided on the ONO film and including a gate electrode.

7. The semiconductor device as claimed in claim 6, wherein the ONO film has multiple charge storage regions under the gate electrode and between bit lines, wherein the bit lines are identical to the first bit line.

8. The semiconductor device as claimed in claim 1, wherein the first impurities of the high concentration diffusion region and the first low concentration diffusion region are formed of arsenic ions implanted in the semiconductor substrate.

9. The semiconductor device as claimed in claim 2 wherein the second impurities of the pocket implantation regions are formed of boron ions implanted in the semiconductor substrate.

10. The semiconductor device as claimed in 5 wherein the third impurities of the second low concentration diffusion regions are formed of phosphorous ions implanted in the semiconductor substrate.

11. A semiconductor device comprising:

a semiconductor substrate;

a first diffusion region formed in the semiconductor substrate comprising first impurities implanted into the semiconductor substrate to a first depth;

a second diffusion region formed only under the first diffusion region comprising the first impurities implanted at a lower concentration than the first diffusion region into the semiconductor substrate to a second depth, the first and second diffusion regions having substantially the same width;

a first bit line formed in the semiconductor substrate and including a source region and a drain region, the first bit line including the first and second diffusion regions; and third diffusion regions formed on each side of the first diffusion region, the third diffusion regions each implanted with second impurities into the semiconductor substrate to a third depth, wherein the second impurities are different from the first impurities, wherein the third diffusion regions are included in the bit line, and wherein the third depth is less than the first depth such that the third diffusion regions do not physically touch the second diffusion region.

12. The semiconductor device as claimed in claim 11, further comprising pocket ion implantation regions formed at both sides of the first diffusion region and comprising third impurities different from the first impurities, the pocket ion implantation regions included in the first bit line.

13. The semiconductor device as claimed in claim 11, further comprising:

an ONO film provided on the semiconductor substrate; and a word line provided on the ONO film and including a gate electrode.

14. The semiconductor device as claimed in claim 13, wherein the ONO film has multiple charge storage regions under the gate electrode and between bit lines, wherein the bit lines are identical to the first bit line.

15. The semiconductor device as claimed in claim 11, wherein the first impurities are formed of arsenic ions implanted in the semiconductor substrate.

16. The semiconductor device as claimed in claim 12 wherein the third impurities are formed of boron ions implanted in the semiconductor substrate.

17. The semiconductor device as claimed in 11 wherein the second impurities are formed of phosphorous ions implanted in the semiconductor substrate.

* * * * *